United States Patent
Nakamura et al.

(10) Patent No.: US 12,350,742 B2
(45) Date of Patent: Jul. 8, 2025

(54) SURFACE-COATED CUTTING TOOL

(71) Applicant: MITSUBISHI MATERIALS CORPORATION, Tokyo (JP)

(72) Inventors: Hiroki Nakamura, Joso (JP); Takuya Ishigaki, Joso (JP); Kousuke Yanagisawa, Naka-gun (JP); Hisashi Honma, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 402 days.

(21) Appl. No.: 17/794,489

(22) PCT Filed: Feb. 3, 2021

(86) PCT No.: PCT/JP2021/003917
§ 371 (c)(1),
(2) Date: Jul. 21, 2022

(87) PCT Pub. No.: WO2021/157609
PCT Pub. Date: Aug. 12, 2021

(65) Prior Publication Data
US 2023/0109216 A1    Apr. 6, 2023

(30) Foreign Application Priority Data

Feb. 3, 2020 (JP) ................. 2020-016659

(51) Int. Cl.
*B23B 27/14* (2006.01)
*C23C 16/36* (2006.01)

(52) U.S. Cl.
CPC ............ *B23B 27/148* (2013.01); *C23C 16/36* (2013.01); *B23B 2228/105* (2013.01)

(58) Field of Classification Search
None
See application file for complete search history.

(56) References Cited

U.S. PATENT DOCUMENTS

| | | |
|---|---|---|
| 2010/0323176 A1 | 12/2010 | Van Den Berg et al. |
| 2016/0040285 A1* | 2/2016 | Tatsuoka ........... C23C 16/34 |
| | | 407/119 |

(Continued)

FOREIGN PATENT DOCUMENTS

| | | |
|---|---|---|
| CN | 107614167 A | 1/2018 |
| CN | 107921550 A | 4/2018 |

(Continued)

OTHER PUBLICATIONS

European Search Report mailed May 15, 2023 for the corresponding European Patent Application No. 21750171.7 (7 pages).

(Continued)

*Primary Examiner* — Seth Dumbris
(74) *Attorney, Agent, or Firm* — Leason Ellis LLP; Melvin C. Garner; Mitsuhiro Haraguchi

(57) ABSTRACT

Provided is a surface-coated cutting tool including a complex carbonitride layer on the tool body, wherein a ratio of crystal grains having a NaCl type face-centered cubic structure is 80 area % or more, $x_{avg}$ and $y_{avg}$ satisfy $0.60 \leq x_{avg} \leq 0.90$ and $0.000 \leq y_{avg} \leq 0.050$, respectively, a composition of the Ti—Al complex carbonitride layer being represented by $(Ti_{1-x}Al_x)(C_yN_{1-y})$, the $x_{avg}$ being an average of x that is an Al content in a total content of Al and Ti, and the $y_{avg}$ being an average of y that is a C content in a total content of C and N, the crystal grains having the NaCl type face-centered cubic structure include crystal grains in which the x repeatedly increases and decreases, the crystal grains include 10 to 40 area % of crystal grains $G_l$ having an average distance of 40 to 160 nm and crystal grains $G_s$ having an average distance of 1 to 7 nm.

4 Claims, 1 Drawing Sheet

(56) References Cited

U.S. PATENT DOCUMENTS

2017/0113285 A1\* 4/2017 Tatsuoka ................. C23C 16/36
2017/0298505 A1\* 10/2017 Tatsuoka ................. C23C 16/34
2017/0342552 A1\* 11/2017 Sato ...................... C23C 28/044

FOREIGN PATENT DOCUMENTS

| | | |
|---|---|---|
| EP | 3103572 A1 | 12/2016 |
| EP | 3127637 A1 | 2/2017 |
| JP | 2011516722 A | 5/2011 |
| JP | 2014129562 A | 7/2014 |
| JP | 2016030319 A | 3/2016 |
| JP | 2016137549 A | 8/2016 |
| JP | 6238131 B | 11/2017 |
| JP | 2018144115 A | 9/2018 |
| JP | 2020151794 A | 9/2020 |

OTHER PUBLICATIONS

International Search Report mailed Apr. 13, 2021 for the corresponding PCT International Patent Application No. PCT/JP2021/003917 ( 4 pages including English translation ).

Chinese Office Action mailed Oct. 27, 2024 for the corresponding Chinese Patent Application No. 202180027449.5 (7 pages including English translation).

\* cited by examiner

GRAIN BOUNDARY (1)

UPPER PART OF CRYSTAL GRAIN ($R_U$)

MID PART OF CRYSTAL GRAIN ($R_M$)

LOWER PART OF CRYSTAL GRAIN ($R_L$)

ANALYSIS LINE (2) IN TEM USING EDS (PARALLEL TO THE THICKNESS DIRECTION)

THICKNESS DIRECTION (3)

INTERVAL (D)

Al CONTENT x

STRAIGHT LINE m (m)

LOCATION IN OBSERVATION DIRECTION (nm)

SURFACE-COATED CUTTING TOOL

CROSS-REFERENCE TO RELATED PATENT APPLICATIONS

This application is a U.S. National Phase Application under 35 U.S.C. § 371 of International Patent Application No. PCT/JP2021/003917 filed on Feb. 3, 2021 and claims the benefit of priority to Japanese Patent Application No. 2020-016659 filed on Feb. 3, 2020, the contents of all of which are incorporated herein by reference in their entireties. The International Application was published in Japanese on Aug. 12, 2021 as International Publication No. WO/2021/157609 under PCT Article 21(2).

FIELD OF THE INVENTION

The present invention relates to, particularly, a surface-coated cutting tool (hereinafter, referred to as a coated tool) that exhibits excellent cutting performance for a long-term usage even in high-speed intermittent cutting work for alloy steel or cast iron since a hard coating layer has excellent chipping resistance and excellent wear resistance.

BACKGROUND OF THE INVENTION

There are conventionally known coated tools in which a Ti—Al complex carbonitride layer are formed on a surface of a tool body made of tungsten carbide (hereinafter, referred to as WC)-based cemented carbide or the like as a hard coating layer by a deposition method. It is known that they exhibit excellent wear resistance.

However, various proposals have been made for the improvement of the durability of the hard coating layer, since abnormal wear such as chipping, is likely to occur in a case where the coated tool is used under severe cutting conditions, such as high-speed intermittent cutting work, even though the coated tools with the Ti—Al complex carbonitride layer in the related art exhibit relatively excellent wear resistance.

For example, Published Japanese Translation No. 2011-516722 of the PCT International Publication discloses a coated tool coated with a hard material. The hard material includes a plurality of layers deposited using CVD; and an $Al_2O_3$ layer is disposed on a $Ti_{1-x}Al_xN$ layer and/or a $Ti_{1-x}Al_xC$ layer and/or a $Ti_{1-x}Al_xCN$ layer (in formulae, x is in a range of 0.65 to 0.95) as an outer layer.

Further, for example, Japanese Unexamined Patent Application, First Publication No. 2014-129562 discloses a coated tool that includes a tool body and one or two or more hard coating layers formed on the surface of the tool body. At least one layer of the hard coating layers is a layer including hard grains; and the hard grains have a multilayer structure in which first unit layers and second unit layers are alternately laminated. The first unit layer includes a first compound that consists of one or more selected from the group consisting of group 4 to 6 elements of the periodic table and Al and one or more selected from the group consisting of B, C, N, and O. The second unit layer includes a second compound that consists of one or more selected from the group consisting of group 4 to 6 elements of the periodic table and Al and one or more selected from the group consisting of B, C, N, and O.

Furthermore, for example, Japanese Patent No. 6238131 discloses a coated tool including one or two or more layers. At least one layer of the layers is a coating layer having a multilayer structure in which first unit layers made of $Ti_{1-x}Al_xN$ and second unit layers made of $Ti_{1-y}Al_yN$ are alternately laminated. The first unit layer has a fcc type crystal structure, x of $Ti_{1-x}Al_xN$ satisfies 0<x<0.65, the second unit layer has a hcp type crystal structure, and y of $Ti_{1-y}Al_yN$ satisfies 0.65≤y<1, and the elastic recovery ratio of the coating layer in a layer thickness direction is 50% or more.

CITATION LIST

Patent Documents

Patent Document 1: Published Japanese Translation No. 2011-516722 of the PCT International Publication
Patent Document 2: Japanese Unexamined Patent Application, First Publication No. 2014-129562
Patent Document 3: Japanese Patent No. 6238131

Technical Problem

In recent years, there has been a strong requirement for labor saving and energy saving in cutting work and cutting work has tended to be faster and more efficient along with this. For this reason, a coated tool requires more resistance for abnormal damage, such as chipping resistance, fracturing resistance, and peeling resistance and requires excellent wear resistance for a long-term usage. However, it could not be said that the coated tools disclosed in Patent Documents described above are sufficient for these requirements.

The present invention has been made in consideration of such circumstances, and an object of the present invention is to provide a coated tool that exhibits excellent chipping resistance and excellent wear resistance for a long-term usage even in a case where the coated tool is used for high-speed intermittent cutting work of alloy steel, cast iron, and the like.

SUMMARY OF THE INVENTION

Solution to Problem

The inventor has made extensive studies in order to measure the chipping resistance and wear resistance of a coated tool including a Ti—Al complex carbonitride layer (hereinafter, referred to as a TiAlCN layer) as a hard coating layer.

As a result, new knowledge to be described below is obtained.

In a case where crystal grains having two types of composition changes in which distances of the repetition of the increase and decrease of a content ratio of Al in the total amount of Ti and Al are different are present in the grains at a predetermined area ratio as crystal grains having a NaCl type face-centered cubic structure in the TiAlCN layer, the movement of dislocations is suppressed and hardness is increased, so that wear resistance is improved. Further, since toughness is improved to prevent the growth of crack caused by a shearing force acting on a surface of which the wear during cutting progresses, an increase in lattice defects caused by an increase in the strain of the TiAlCN layer is mitigated, and the formation of the paths of the growth of cracks are suppressed. As a result, the chipping resistance of a surface-coated cutting tool is further improved.

Aspects of the present invention (hereinafter, referred to "a surface-coated cutting tool of the present invention") are based on the above-mentioned knowledge, and are as follows.

(1) A surface-coated cutting tool including: a tool body; and a hard coating layer that includes a Ti—Al complex carbonitride layer on a surface of the tool body, wherein (a) a ratio of crystal grains of Ti—Al complex carbonitride, which has a NaCl type face-centered cubic structure, in the Ti—Al complex carbonitride layer is 80 area % or more, (b) in the Ti—Al complex carbonitride layer, $x_{avg}$ and $y_{avg}$ satisfy $0.60 \leq x_{avg} \leq 0.90$ and $0.000 \leq y_{avg} \leq 0.050$, respectively, a composition of the Ti—Al complex carbonitride layer being represented by a composition formula of $(Ti_{1-x}Al_x)(C_yN_{1-y})$, the $x_{avg}$ being an average of x that is an Al content in a total content of Al and Ti, the $y_{avg}$ being an average of y that is a C content in a total content of C and N, and the x, the y, the $x_{avg}$ and $y_{avg}$ being atomic ratios, (c) the crystal grains which have the NaCl type face-centered cubic structure include crystal grains in which the x repeatedly increases and decreases in a direction perpendicular to the surface of the tool body, (d) the crystal grains in which the x repeatedly increases and decreases include 10 to 40 area % of crystal grains $G_l$ including a region having a first distance $d_{avgl}$ in which an average distance of the repeated increase and decrease is 40 to 160 nm, and (e) the crystal grains in which the x repeatedly increases and decreases include 60 area % or more of crystal grains $G_s$ including a region having a second distance $d_{avgs}$ in which an average distance of the repeated increase and decrease is 1 to 7 nm.

(2) The surface-coated cutting tool according to (1), wherein the crystal grains in which the x repeatedly increases and decreases include 10 to 30 area % of crystal grains GC, including the region having the first distance $d_{avgl}$ and the region having the second distance $d_{avgs}$ in a single crystal grain.

(3) The surface-coated cutting tool according to (1) or (2), wherein the crystal grains having the NaCl type face-centered cubic structure has an average grain width w of 0.10 to 2.00 μm and an average aspect ratio A of 2.0 to 10.0.

(4) The surface-coated cutting tool according to any one of (1) to (3), wherein in the crystal grains in which the x repeatedly increases and decreases, an average value Δx is 0.05 to 0.20 in the region having the first distance $d_{avgl}$ and 0.03 to 0.10 in the region having the second distance $d_{avgs}$, the Δx being a difference between a local maximum $x_{max}$ and a local minimum $x_{min}$ adjacent to each other.

Advantageous Effects of Invention

A surface-coated cutting tool according to the aspect of the present invention exhibits excellent chipping resistance and excellent wear resistance for a long-term usage even in a case where the coated tool is used for high-speed intermittent cutting work of alloy steel, cast iron, and the like.

DETAILED DESCRIPTION OF THE INVENTION

Figure 1:
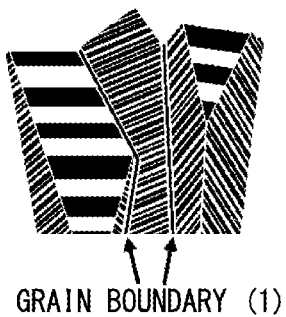
FIG. 1 is a schematic diagram of a high angle scattering dark field image of crystal grains that have a NaCl type face-centered cubic structure and include a region where a content ratio x of Al repeatedly increases and decreases.

A surface-coated cutting tool according to an embodiment of the present invention will be described in detail below. In a case where a numerical range is expressed as "A to B" in this specification and claims, the range includes the numerical values of an upper limit (B) and a lower limit (A). Further, the units of the upper limit (B) and the lower limit (A) are the same.

Average Layer Thickness of TiAlCN Layer:

A TiAlCN layer of the surface-coated cutting tool according to the embodiment of the present invention forms a hard coating layer. That is, the hard coating layer includes the TiAlCN layer. It is preferable that an average layer thickness of the TiAlCN layer is in a range of 1.0 to 20.0 μm. In a case where the average layer thickness is less than 1.0 μm, wear resistance for a long-term usage cannot be sufficiently ensured since the layer thickness is small. On the other hand, in a case where the average layer thickness exceeds 20.0 μm, chipping is likely to occur since the crystal grains of the TiAlCN layer are likely to coarsen. It is more preferable that the average layer thickness is in a range of 3.0 to 15.0 μm.

Here, it is possible to obtain the average layer thickness of the TiAlCN layer, for example, by cutting the TiAlCN layer along a vertical section (a surface perpendicular to the surface of a tool body) at an arbitrary position using a focused ion beam system (FIB), a cross section polisher (CP), or the like to produce a specimen for observation, by observing the vertical section of the specimen for observation at a plurality of zones (for example, five zones) using a scanning electron microscope (SEM), a transmission electron microscope (TEM), a scanning transmission electron microscope (STEM), or an energy dispersive X-ray spectrometry (EDX) apparatus with SEM or TEM, and by averaging values observed at the plurality of zones.

Ratio of Area in which Crystal Grains Forming TiAlCN Layer have NaCl Type Face-Centered Cubic Structure:

It is preferable that a ratio of an area in which TiAlCN crystal grains forming the TiAlCN layer have a NaCl type face-centered cubic structure is 80 area % or more. The reason for this is that the object of the present invention can be more reliably achieved in a case where a ratio of an area in which TiAlCN crystal grains forming the TiAlCN layer have a NaCl type face-centered cubic structure is 80 area % or more. All the crystal grains may have a NaCl type face-centered cubic structure (a ratio of an area in which TiAlCN crystal grains forming the TiAlCN layer have a NaCl type face-centered cubic structure may be 100 area %).

A result at the time of determination of grain boundaries (1) to be described later are used for a ratio of an area in which crystal grains have a NaCl type face-centered cubic structure.

An area ratio means a ratio of an area in the vertical section of the TiAlCN layer.

Average Composition of TiAlCN Layer:

In a case where a composition of the TiAlCN layer of the surface-coated cutting tool according to the embodiment of the present invention is represented by a composition formula of $(Ti_{1-x}Al_x)(C_yN_{1-y})$, it is preferable that an average $x_{avg}$ of a content ratio x of Al (hereinafter, referred to as "an average of an Al content ratio") in the total amount of Ti and Al satisfies $0.60 \leq x_{avg} \leq 0.90$ and an average $y_{avg}$ of a content ratio y of C (hereinafter, referred to as "an average of a C content ratio") in the total amount of C and N satisfies $0.000 \leq y_{avg} \leq 0.050$ (here, all of $x_{avg}$ and $y_{avg}$ are atomic ratios).

A ratio of $(C_y N_{1-y})$ to $(Ti_{1-x} Al_x)$ is not particularly limited, but it is preferable that a ratio of $(C_y N_{1-y})$ is set in a range of 0.8 to 1.2 in a case where $(Ti_{1-x} Al_x)$ is 1.

The reason for this is as follows.

In a case where an average $x_{avg}$ of an Al content ratio is less than 0.60, the hardness of the TiAlCN layer is inferior. For this reason, in a case where the surface-coated cutting tool is used for the high-speed intermittent cutting of alloy steel, cast iron, and the like, wear resistance is not sufficient. On the other hand, in a case where an average $x_{avg}$ of an Al content ratio exceeds 0.90, hexagonal crystal grains are precipitated and wear resistance is reduced. Accordingly, $0.60 \leq x_{avg} \leq 0.90$ is preferable and $0.70 \leq x_{avg} \leq 0.90$ is more preferable.

Further, the reason why $0.000 \leq y_{avg} \leq 0.050$ is preferable as the range of an average $y_{avg}$ of a C content ratio is that hardness can be improved while chipping resistance is maintained in the above-mentioned range. Accordingly, $0.000 \leq y_{avg} \leq 0.050$ is preferable and $0.010 \leq y_{avg} \leq 0.050$ is more preferable.

An average $x_{avg}$ of an Al content ratio of the TiAlCN layer is the averages of analysis results of auger electrons obtained in a case where the specimen of which the section is polished is irradiated with an electron beam from a vertical section side and at least five line analyses are performed over the entire length in a film thickness direction (a direction perpendicular to the surface of the tool body) using an auger electron spectroscopy (AES).

Further, an average $y_{avg}$ of a C content ratio is obtained using secondary ion mass spectrometry (SIMS). That is, a range of 70 μm×70 μm of the specimen of which the surface is polished is irradiated with an ion beam from the surface side of the TiAlCN layer and a surface analysis using an ion beam and etching using the sputtering of an ion beam are alternately repeated to measure composition in a depth direction. First, with regard to the TiAlCN layer, an average of data, which are obtained from measurement for a depth of at least 0.5 μm performed at a pitch of 0.1 μm or less from a point positioned at a depth of 0.5 μm or more in a depth direction of the layer, is obtained. In addition, results, which are calculated from the repetition of this measurement at least at five zones on the surface of the specimen, are averaged to obtain an average $y_{avg}$ of a C content ratio.

Repeated Increase and Decrease of Content Ratio x of Al of TiAlCN Layer:

In the vertical section of the TiAlCN layer, it is preferable that crystal grains $G_1$ including a region having a first distance $d_{avg1}$ in which an average distance of the repeated increase and decrease of a content ratio x of Al in the total amount of Ti and Al in a layer thickness direction (3) is in a range of 40 to 160 nm are present in a range of 10 to 40 area %, and crystal grains $G_s$ including a region having a second distance $d_{avgs}$ in which the average distance is in a range of 1 to 7 nm are present in a range of 60 area % or more. The layer thickness direction (3) is the thickness direction of the TiAlCN layer, and a variation of about 10 degrees, which is a measurement tolerance, is allowed in the same direction.

It is prescribed that the crystal grains $G_1$ includes a region having the first distance $d_{avg1}$, but this prescription means that crystal grains having the second distance $d_{avgs}$ or crystal grains having other distances may be present as long as crystal grains having the first distance $d_{avg1}$ as an average distance of the repeated increase and decrease of x are present in the crystal grains $G_1$. Likewise, it is prescribed that the crystal grains $G_s$ includes a region having the second distance $d_{avgs}$, but this prescription means that crystal grains having the first distance $d_{avg1}$ or crystal grains having other distances may be present as long as crystal grains having the second distance $d_{avgs}$ as an average distance of the repeated increase and decrease of x are present.

Here, the repetition of the increase and decrease of a content ratio x of Al means that the increase and decrease of an Al content ratio x are repeated adjacently in a case where a line analysis to be described later is performed in the layer thickness direction (3). Further, in the adjacent repetition, a distance between adjacent local maximums or between adjacent local minimums is referred to as a distance of the repetition of the increase and decrease and an average value of this distance for each analysis line (2) of the line analysis is divided into the first distance and the second distance described above.

In a case where a ratio of the crystal grains $G_1$ having the first distance $d_{avg1}$ as a distance of the repeated increase and decrease is less than 10 area %, it cannot be said that the improvement of hardness and the suppression of the growth of cracks caused by the suppression of the movement of dislocations on a surface where wear progresses during cutting are sufficient. On the other hand, in a case where a ratio of the crystal grains $G_1$ exceeds 40 area %, lattice defects caused by an increase in the strain of the TiAlCN layer are increased. For this reason, hardness decreases and many crack growth paths are formed, so that chipping resistance is reduced.

Further, in a case where a ratio of the crystal grains $G_s$ having the second distance $d_{avgs}$ as a distance of the repeated increase and decrease is less than 60 area %, it cannot be said that the improvement of hardness caused by the suppression of the movement of dislocations is sufficient. Furthermore, an effect of suppressing the growth of cracks is reduced, so that chipping resistance is reduced.

In addition, it is more preferable that crystal grains $G_{1s}$ having a NaCl type face-centered cubic structure, which include both the regions having the first distance $d_{avg1}$ and the second distance $d_{avgs}$ in the same crystal grains, are present in a range of 10 to 30 area % in the vertical section of the TiAlCN layer. In a case where the crystal grains $G_{1s}$ are present in a range of 10 to 30 area %, the growth of cracks is more reliably suppressed.

Average value Δx of difference between local maximum $x_{max}$ and local minimum $x_{min}$, which are adjacent to each other, of content ratio x of Al:

It is more preferable that an average value Δx of a difference between the local maximum $x_{max}$ and the local minimum $x_{min}$, which are adjacent to each other, of a content ratio x of Al is in a range of 0.05 to 0.20 in the region having the first distance $d_{avg1}$ and is in a range of 0.03 to 0.10 in the region having the second distance $d_{avgs}$. The reason for this is as follows: In a case where the average value Δx is less than 0.05 in the region having the first distance $d_{avg1}$ and is less than 0.03 in the region having the second distance $d_{avgs}$, an effect of suppressing the growth of cracks during cutting work is reduced, so that chipping resistance is reduced. On the other hand, in a case where the average value Δx exceeds 0.20 in the region having the first distance $d_{avg1}$ and exceeds 0.10 in the region having the second distance $d_{avgs}$, the lattice strain of the crystal grains is excessively increased, so that lattice defects are increased and wear resistance and chipping resistance are reduced.

FIG. 1 shows a schematic diagram of a high angle scattering dark field image of crystal grains including a region where an Al content ratio x repeatedly increases and decreases. Three crystal grains are shown in FIG. 1, a middle crystal grain is $G_s$, and the crystal grains positioned on both sides of the middle crystal grain are $G_{1s}$. Since FIG. 1 is a schematic diagram, the size of each crystal grain and the accurate dimension (ratio) of a distance of a repeated change in the increase and decrease of a content ratio x of Al, which can be read from FIG. 1, is not shown.

Here, a method of measuring a repeated change in the increase and decrease of a content ratio x of Al of the TiAlCN layer will be described.

First, crystal grain boundaries of crystal grains forming the TiAlCN layer are obtained and the crystal grains are specified as follows. That is, while a polished surface (vertical section) perpendicular to the surface of the tool body is precession-irradiated with an electron beam tilted with respect to a normal direction to the polished surface by an angle of 0.5° to 1.0° using a crystal orientation analyzer attached to a transmission electron microscope, the polished surface is scanned with an electron beam at an arbitrary beam diameter and an arbitrary distance, an electron diffraction pattern is continuously taken, and the crystal orientation of each measurement point is analyzed. The crystal grain boundaries are determined with respect to an observation field of view having a width of 50 µm in a direction parallel to the surface of the tool body and a layer thickness (average layer thickness) in a vertical direction.

Conditions required to acquire the electron beam diffraction pattern used in this measurement include an acceleration voltage of 200 kV, a camera length of 20 cm, a beam size of 2.4 nm, and a measurement step of 5.0 nm. At this time, the measured crystal orientation is obtained from the discrete examination of a measurement surface, and is obtained as the orientation distribution of the entire measurement surface by representing a region up to the middle between adjacent measurement points with a measurement result. A regular hexagonal region can be exemplified as a region (hereinafter, referred to as a pixel) represented by these measurement points. In a case where there is an angular difference of 5° or more in crystal orientation between adjacent pixels or in a case where a NaCl type face-centered cubic structure is shown in only one of the adjacent pixels, the sides of a region with which these pixels are in contact are defined as grain boundaries (1). A portion surrounded by the sides defined as the grain boundaries (1) is defined as one crystal grain. However, pixels, which are present independently as in a case where all adjacent pixels have an orientation difference of 5° or more or adjacent measurement points having a NaCl type face-centered cubic structure are not present, are not defined as crystal grains and two or more pixels connected to each other are treated as crystal grains. In this way, the grain boundaries are determined to specify crystal grains.

Figure 2:
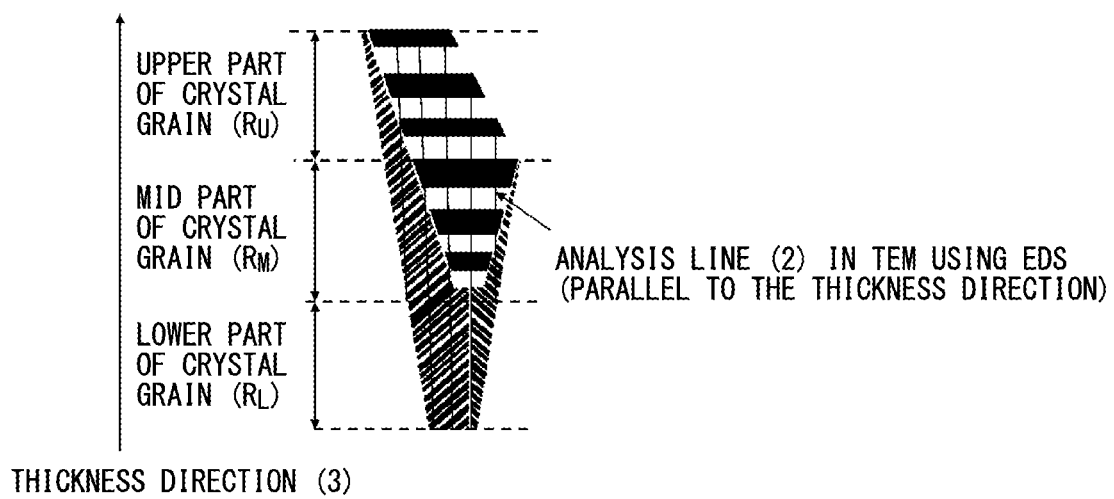
FIG. 2 is a schematic diagram showing measurement zones for line analyses that are performed using energy dispersive X-ray spectrometry with a transmission electron microscope.

Next, a method of measuring an average distance of the repetition of the increase and decrease of a content ratio x of Al of the TiAlCN layer will be described. An observation field of view including at least 10 crystal grains specified by the above procedure is defined, and a line analysis (a measurement distance of 0.5 nm or less) passing in the layer thickness direction (3) is performed in each crystal grain with energy dispersive X-ray spectrometry (EDS) using TEM. That is, in a case where a crystal grain is divided into three equal portions in the layer thickness direction (3) as shown in FIG. 2, five line analyses passing in the layer thickness direction (3) are performed in each of ranges of an upper portion ($R_U$), a middle ($R_M$), and a lower portion ($R_L$) of the crystal grain. This line analysis is performed in all the crystal grain included in the observation field of view. A distance between the five line analyses in each of the ranges $R_U$, $R_M$, and $R_L$ is a distance that divides the maximum length in a horizontal direction from the surface of the tool body into six equal portions in each range. The length of the analysis line (2) for each crystal grain is a length at which the number of distances of the repetition of the increase and decrease of a content ratio x of Al is 2 or more. However, in a case where an average value of the distances is 7 nm or less, the length of the analysis line (2) is set to 80 nm. In a case where there is a range of which the length in the layer thickness direction is less than 80 nm among the ranges $R_U$, $R_M$, and $R_L$, a line analysis is performed over the entire length in the layer thickness direction (3) in the range of which the length in the layer thickness direction is less than 80 nm. Then, an average value (average distance) of the distances of the repetition of the increase and decrease of a content ratio x of Al for each analysis line (2) is obtained.

At this time, in a case where crystal grains include two or more analysis lines (2) having an average distance of 40 to 160 nm, the crystal grains are defined as crystal grains having the repetition of the increase and decrease of a content ratio x of Al having the first distance $d_{avg1}$. Further, in a case where crystal grains include two or more analysis lines (2) having an average distance of 1 to 7 nm, the crystal grains are defined as crystal grains having the repetition of the increase and decrease of a content ratio x of Al having the second distance $d_{avgs}$. Furthermore, area ratios of the crystal grains having the first distance $d_{avg1}$ and the second distance $d_{avgs}$ in the observation field of view are calculated.

Here, it goes without saying that the crystal grains having the first distance $d_{avg1}$ and the crystal grains having the second distance $d_{avgs}$ overlap with each other in the calculation of the area ratio.

A method of obtaining an average value Δx of a difference between the local maximum $x_{max}$ and the local minimum $x_{min}$, which are adjacent to each other, of a content ratio x of Al will be described. Δx of a region having the first distance $d_{avg1}$ is defined as Δx1, and Δx of a region having the second distance $d_{avgs}$ is defined as $Δx_s$.

Line analyses are performed as described above to obtain an average value of a difference between the local maximum $x_{max}$ and the local minimum $x_{min}$, which are adjacent to each other, in the repetition of the increase and decrease of an Al content ratio x for each analysis line (2) having the first distance $d_{avg1}$. Then, a value obtained by averaging the average values for all analysis lines (2) having the first distance $d_{avg1}$ is calculated as $Δx_1$. Likewise for $Δx_s$, an average value of a difference between the local maximum $x_{max}$ and the local minimum $x_{min}$, which are adjacent to each other, in the repetition of the increase and decrease of an Al content ratio x is obtained for each analysis line (2) having the second distance $d_{avgs}$, and a value obtained by averaging the average values for all analysis lines (2) having the second distance $d_{avgs}$ is calculated as $Δx_s$.

Figure 3:
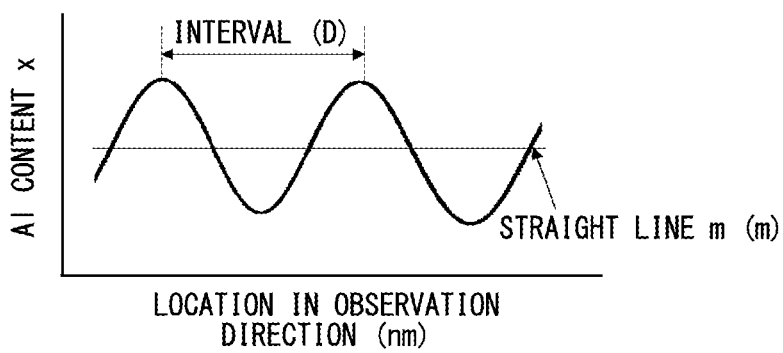
FIG. 3 is a schematic diagram showing a relationship between a position in an observation direction and the repetition of the increase and decrease of a content ratio x of Al in the line analysis that is performed using energy dispersive X-ray spectrometry with a transmission electron microscope.

Here, an average distance of the repetition of the increase and decrease of a content ratio x of Al for each analysis line (2) is obtained as follows. A relationship between a position in an observation direction and the repetition of the increase and decrease of a content ratio x of Al is shown graphically, and average distances $d_{avg1}$ and $d_{avgs}$ are obtained. That is, the repetition of the increase and decrease of a content ratio x of Al is measured, and a straight line m (m) crossing a curve, which shows the repetition of the increase and decrease, is drawn to the curve (see FIG. 3). The straight line m is drawn such that the area of a region surrounded by the curve on the upper side of the straight line is equal to that on the lower side of the straight line. Further, a local maximum or a local minimum is obtained for each region where the straight line m crosses the curve showing a repeated change in an Al content ratio x. It goes without saying that the removal of measurement noise publicly known is performed in a case where the relationship is shown graphically.

In FIG. 1, a black region represents a region above the straight line m and a white region represents a region below the straight line m.

Further, in a case where five line analyses are performed in each of ranges of an upper portion ($R_U$), a middle ($R_M$), and a lower portion ($R_L$) of each crystal grain to obtain an average value of the distances (D) of the repetition of the increase and decrease of a content ratio x of Al for each analysis line (2) and two or more analysis lines (2) having an average distance of 40 to 160 nm and two or more analysis lines (2) having an average distance of 1 to 7 nm are present in the same crystal grains, the crystal grains are defined as crystal grains $G_{1s}$ having a NaCl type face-centered cubic structure that include both the regions having the first distance $d_{avg1}$ and the second distance $d_{avgs}$ in the same crystal grains.

Average grain width W and average aspect ratio A of TiAlCN layer:

It is more preferable that the TiAlCN layer of the surface-coated cutting tool according to the embodiment of the present invention has a columnar crystal structure, an average grain width W of the crystal grains having the structure in the vertical section is in a range of 0.10 to 2.00 μm, and an average aspect ratio A thereof is in a range of 2.0 to 10.0. The reason for this is as follows: In the case of a fine crystal having an average grain width W less than 0.10 μm, the reduction of plastic deformation resistance caused by an increase in grain boundaries (1) and an abnormal damage caused by the reduction of oxidation resistance are likely to occur. On the other hand, in a case where an average grain width W is larger than 2.00 μm, toughness is likely to be reduced due to the presence of coarsely grown grains. Further, in the case of a granular crystal having an average aspect ratio A less than 2.0, an interface is likely to be a starting point of the breakage due to shear stress generated on the surface of the hard coating layer during cutting, which may cause chipping. Furthermore, in a case where an average aspect ratio A exceeds 10.0, minute chipping occurs at an edge tip during cutting. For this reason, in a case where an adjacent columnar crystal structure is chipped, resistance to shear stress generated on the surface of the hard coating layer is likely to be reduced. As a result, in a case where the columnar crystal structure is broken, damage may progress at once and large chipping may occur. Accordingly, it is preferable that an average grain width W of the crystal grains is in a range of 0.10 to 2.00 μm and an average aspect ratio A thereof is in a range of 2.0 to 10.0.

Next, methods of calculating the average grain width W and the average aspect ratio A of the crystal grains and the area ratio of crystal grains having a NaCl type face-centered cubic structure and a columnar crystal structure will be described. First, as described above, the grain boundaries (1) are determined to specify crystal grains. Next, image processing is performed to obtain the maximum length $H_i$ of a certain crystal grain i in a direction perpendicular to the surface of the tool body, a grain width $W_i$ that is the maximum length of the crystal grain i in a horizontal direction with respect to the surface of the tool body, and the area $S_i$ of the crystal grain i. The aspect ratio $A_i$ of the crystal grain i is calculated from "$A_i = H_i/W_i$". In this way, an area-weighted average of the grain widths $W_1$ to $W_n$ (n≥, 20) of at least 20 or more (i=1 to 20 or more) crystal grains included in the observation field of view is obtained as the average grain width W of the crystal grains from Equation 1. Further, the aspect ratios $A_1$ to $A_n$ (n≥20) of the crystal grains are obtained in the same manner, and an area-weighted average of the aspect ratios is obtained as the average aspect ratio A of the crystal grains from Equation 2.

$$W = \frac{W_1 S_1 + W_2 S_2 + W_3 S_3 + \ldots + W_n S_n}{S_1 + S_2 + S_3 + \ldots + S_n} \quad \text{[Equation 1]}$$

$$A = \frac{A_1 S_1 + A_2 S_2 + A_3 S_3 + \ldots + A_n S_n}{S_1 + S_2 + S_3 + \ldots + S_n} \quad \text{[Equation 2]}$$

Other Layers:

As a hard coating layer, the hard coating layer including the TiAlCN layer of the surface-coated cutting tool according to the embodiment of the present invention has sufficient chipping resistance and wear resistance in high-speed intermittent cutting work for alloy steel or cast iron. However, separately from the hard coating layer, in a case where a lower layer including a Ti compound (not limited to a stoichiometric compound) layer, which consists of one layer or two or more layers of a carbide layer, a nitride layer, a carbonitride layer, a carbonate layer, and an oxycarbonitride layer of Ti and has an average total layer thickness of 0.1 to 20.0 μm, is provided adjacent to the tool body and/or in a case where a layer including at least an aluminum oxide (not limited to a stoichiometric compound) layer is provided on the TiAlCN layer as an upper layer with an average total layer thickness of 1.0 to 25.0 μm, even more excellent chipping resistance and even more excellent wear resistance can be exhibited in combination with the effects of these layers.

Here, in a case where the average total layer thickness of the lower layer is less than 0.1 μm, the effects of the lower layer are not sufficiently exhibited. On the other hand, in a case where the average total layer thickness of the lower layer exceeds 20.0 μm, crystal grains of the lower layer are likely to coarsen, so that chipping is likely to occur. Further, in a case where the average total layer thickness of the upper layer including the aluminum oxide layer is less than 1.0 μm, the effects of the upper layer are not sufficiently exhibited. On the other hand, in a case where the average total layer thickness of the upper layer including the aluminum oxide layer exceeds 25.0 μm, crystal grains of the upper layer are likely to coarsen, so that chipping is likely to occur.

Tool Body:

Any base material publicly known in the related art as this kind of tool body can be used for the tool body as long as the achievement of the object of the present invention is not hindered. For example, it is preferable that the tool body may be one of cemented carbide (WC-based cemented carbide; a material which contains Co in addition to WC and to which carbonitride, such as Ti, Ta, and Nb, is added; and the like), cermet (a material containing TiC, TiN, TiCN, or the like as a main component; and the like), ceramics (titanium carbide, silicon carbide, silicon nitride, aluminum nitride, aluminum oxide, and the like), a cBN sintered material, or a diamond sintered body.

Manufacturing Method:

It is possible to obtain the TiAlCN layer of the surface-coated cutting tool according to the embodiment of the present invention by supplying two types of reaction gas, which consist of, for example, a gas group A consisting of $NH_3$ and $H_2$ and a gas group B consisting of $AlCl_3$, $TiCl_4$, $N_2$, $CH_4$, $C_2H_4$, and $H_2$, for example, onto the tool body or onto at least one of a carbide layer, a nitride layer, a carbonitride layer, a carbonate layer, and an oxycarbonitride layer of Ti, which are the lower layer provided on the tool body, with a predetermined phase difference in two systems and by causing the two types of reaction gas to join each other in a CVD furnace.

The composition of the two types of reaction gas is exemplified as follows. With regard to the composition of gas, the sum of the composition of the gas group A and the composition of the gas group B is 100 volume %. Here, the composition of the gas group B consists of supply line 1 and supply line 2.

Gas Group A:
$NH_3$: 2.0 to 5.0%, $H_2$: 65 to 75%
Gas Group B:
Supply Line 1:
$AlCl_3$: 0.65 to 1.02%, $TiCl_4$: 0.03 to 0.43%, $N_2$: 0.0 to 10.0%, $CH_4$: 0.1 to 3.0%, $C_2H_4$: 0.1 to 3.0%, $H_2$: remainder
Supply Line 2:
$AlCl_3$: 0.58 to 1.03%, $TiCl_4$: 0.12 to 0.49%, $N_2$: 0.0 to 8.2%, $CH_4$: 0.1 to 2.9%, $C_2H_4$: 0.1 to 3.0%, $H_2$: remainder
Pressure of reaction atmosphere: 4.0 to 5.0 kPa
Temperature of reaction atmosphere: 700 to 850° C.
Gas supply cycle: 2.00 to 15.00 sec
Gas supply time per cycle: 0.15 to 0.25 sec
Phase difference between supply of gas group A and supply of gas group B: 0.10 to 0.20 sec
Phase difference between supply line 1 and supply line 2: 1.00 to 7.50 sec

EXAMPLES

Next, examples will be described.

Here, an example in which the present invention is applied to an insert cutting tool using WC-based cemented carbide as a tool body will be described as a specific example of a coated tool of the present invention, but the same applies to a case where the other of the materials described above is used as a tool body and the same applies to a case where the present invention is applied to a drill and an end mill.

WC powder, TiC powder, TaC powder, NbC powder, $Cr_3C_2$ powder, ZrC powder, TiN powder, and Co powder having an average particle size of 1 to 3 μm were prepared as raw material powder. These raw material powders were blended into blended composition shown in Table 1, and wax was further added to the raw material powder and were mixed in acetone for 24 hours by a ball mill. The obtained mixed powder was dried under reduced pressure and then press-molded into a green compact having a predetermined shape at a pressure of 98 MPa. This green compact was vacuum-sintered under the conditions, in a vacuum of 5 Pa at a predetermined temperature in a range of 1370 to 1470° C. holding for 1 hour. After the green compact is sintered, tool bodies A to C made of WC-based cemented carbide and having an insert shape of ISO standard SEEN1203AFSN and tool bodies D to F made of WC-based cemented carbide and having an insert shape of ISO standard CNMG120412 were manufactured.

Next, a TiAlCN layer was formed on the surfaces of these tool bodies A to F under deposition conditions shown in Table 2 by CVD using a CVD apparatus to obtain coated tools 1 to 16 of the present invention shown in Table 5. Here, a lower layer and/or an upper layer was deposited on the coated tools 4 to 8, 11, 13, 15, and 16 of the present invention as shown in Table 4 under deposition conditions shown in Table 3.

Further, for comparison, a TiAlCN layer was formed on the surfaces of these tool bodies A to F under deposition conditions shown in Table 2 by CVD to obtain coated tools 1 to 16 of comparative examples shown in Table 5. Here, a lower layer and/or an upper layer was deposited on the coated tools 4 to 8, 11, 13, 15, and 16 of the comparative examples as shown in Table 4 under deposition conditions shown in Table 3.

TABLE 1

| | | Blended composition (mass %) | | | | | | |
|---|---|---|---|---|---|---|---|---|
| Type | | Co | TiC | ZrC | TaC | NbC | $Cr_3C_2$ | TiN | WC |
| Tool body | A | 8.0 | 1.7 | — | — | 3.0 | 0.2 | — | Remainder |
| | B | 8.0 | — | — | 1.7 | 1.0 | — | — | Remainder |
| | C | 8.5 | — | — | — | — | — | — | Remainder |
| | D | 7.0 | — | 1.2 | — | 2.8 | 0.3 | 1.5 | Remainder |
| | E | 6.0 | 2.5 | — | 3.3 | 1.7 | — | 1.4 | Remainder |
| | F | 8.0 | — | — | — | — | 0.2 | — | Remainder |

"—": not contained

TABLE 2

| Formation of TiAlCN layer | | Gas composition (volume %) of reaction gas | | | | | | | | | | | | |
|---|---|---|---|---|---|---|---|---|---|---|---|---|---|---|
| | | Composition of reaction gas group A | Composition of reaction gas group B | | | | | | | | | | | |
| | | | Supply line 1 | | | | | | Supply line 2 | | | | | |
| Deposition step type | Formation symbol | $NH_3$ | $H_2$ | $AlCl_3$ | $TiCl_4$ | $N_2$ | $CH_4$ | $C_2H_4$ | $H_2$ | $AlCl_3$ | $TiCl_4$ | $N_2$ | $CH_4$ | $C_2H_4$ | $H_2$ |
| Step of present invention | A | 2.0 | 65 | 0.86 | 0.43 | 1.8 | 1.6 | 2.1 | Remainder | 0.80 | 0.49 | 2.4 | 1.4 | 2.0 | Remainder |
| | B | 4.2 | 75 | 0.81 | 0.23 | 10.0 | 0.1 | 0.1 | Remainder | 0.89 | 0.16 | 8.2 | 0.1 | 0.1 | Remainder |
| | C | 2.8 | 75 | 0.91 | 0.10 | 4.1 | 2.9 | 3.0 | Remainder | 0.71 | 0.31 | 4.1 | 2.9 | 3.0 | Remainder |
| | D | 3.5 | 70 | 0.84 | 0.31 | 4.8 | 1.3 | 1.8 | Remainder | 1.03 | 0.12 | 4.1 | 1.2 | 1.9 | Remainder |
| | E | 3.5 | 65 | 0.65 | 0.09 | 5.7 | 2.3 | 2.8 | Remainder | 0.58 | 0.16 | 8.0 | 2.3 | 2.8 | Remainder |
| | F | 4.5 | 75 | 1.02 | 0.03 | 0.0 | 2.7 | 2.4 | Remainder | 0.86 | 0.20 | 0.0 | 2.8 | 2.6 | Remainder |
| | G | 5.0 | 70 | 0.69 | 0.30 | 2.3 | 1.6 | 2.0 | Remainder | 0.75 | 0.23 | 5.1 | 1.6 | 2.0 | Remainder |
| | H | 3.9 | 75 | 0.69 | 0.38 | 5.3 | 3.0 | 2.7 | Remainder | 0.60 | 0.47 | 4.1 | 2.6 | 2.7 | Remainder |

TABLE 2-continued

| | | | | | | | | | | | | | | | |
|---|---|---|---|---|---|---|---|---|---|---|---|---|---|---|---|
| Comparative | A' | 2.9 | 65 | 0.65 | 0.69 | 0.0 | 2.9 | 2.1 | Remainder | 0.49 | 0.84 | 0.0 | 2.9 | 2.2 | Remainder |
| step | B' | 2.6 | 65 | 0.58 | 0.16 | 1.0 | 2.7 | 3.0 | Remainder | 0.71 | 0.03 | 3.8 | 2.5 | 3.0 | Remainder |
| | C' | 2.0 | 65 | 0.54 | 0.28 | 7.6 | 5.5 | 5.9 | Remainder | 0.60 | 0.22 | 6.9 | 5.6 | 4.7 | Remainder |
| | D' | 0.9 | 75 | 0.88 | 0.37 | 10.5 | 0.0 | 2.4 | Remainder | 1.01 | 0.24 | 11.0 | 0.0 | 2.2 | Remainder |
| | E' | 10.2 | 75 | 1.02 | 0.07 | 7.7 | 1.8 | 1.4 | Remainder | 0.90 | 0.19 | 7.8 | 1.7 | 1.3 | Remainder |
| | F' | 4.4 | 65 | 0.71 | 0.17 | 3.2 | 2.1 | 1.3 | Remainder | 0.66 | 0.22 | 5.7 | 2.0 | 1.3 | Remainder |
| | G' | 2.8 | 70 | 0.88 | 0.02 | 5.0 | 0.0 | 0.0 | Remainder | 0.85 | 0.05 | 4.3 | 0.0 | 0.0 | Remainder |
| | H' | 2.3 | 70 | 0.50 | 0.23 | 7.4 | 2.8 | 0.0 | Remainder | 0.57 | 0.17 | 5.0 | 3.0 | 0.0 | Remainder |

| | | | Formation condition | | | | | | |
|---|---|---|---|---|---|---|---|---|---|
| | Formation of TiAlCN layer | | Gas group A | | Gas group B | | Phase difference between supply of gas group A and supply of gas group B | Phase difference between Supply line 1 and Supply line 2 | Reaction atmosphere | |
| Deposition step type | Formation symbol | Supply cycle (sec) | Supply time per cycle (sec) | Supply cycle (sec) | Supply time per cycle (sec) | | | Pressure (kPa) | Temperature (° C.) |
| Step of present invention | A | 5.00 | 0.20 | 5.00 | 0.20 | 0.14 | 4.00 | 5.0 | 750 |
| | B | 2.00 | 0.25 | 2.00 | 0.25 | 0.13 | 1.00 | 4.2 | 800 |
| | C | 11.00 | 0.16 | 11.00 | 0.16 | 0.14 | 7.50 | 4.7 | 850 |
| | D | 9.00 | 0.19 | 9.00 | 0.19 | 0.13 | 4.50 | 4.5 | 700 |
| | E | 13.00 | 0.20 | 13.00 | 0.20 | 0.12 | 2.50 | 4.0 | 750 |
| | F | 4.00 | 0.22 | 4.00 | 0.22 | 0.13 | 3.50 | 5.0 | 800 |
| | G | 15.00 | 0.15 | 15.00 | 0.15 | 0.20 | 6.00 | 4.7 | 850 |
| | H | 6.00 | 0.21 | 6.00 | 0.21 | 0.10 | 2.50 | 5.0 | 750 |
| Comparative step | A' | 7.00 | 0.24 | 7.00 | 0.24 | 0.12 | 4.00 | 4.7 | 850 |
| | B' | 2.00 | 0.22 | 2.00 | 0.22 | 0.16 | 1.00 | 4.7 | 950 |
| | C' | 11.00 | 0.21 | 11.00 | 0.21 | 0.20 | 6.50 | 4.5 | 800 |
| | D' | 9.00 | 0.23 | 9.00 | 0.23 | 0.19 | 3.00 | 5.0 | 700 |
| | E' | 8.00 | 0.16 | 8.00 | 0.16 | 0.15 | 1.00 | 4.7 | 700 |
| | F' | 4.00 | 0.20 | 4.00 | 0.20 | 0.10 | 0.00 | 4.2 | 750 |
| | G' | 7.00 | 0.16 | 7.00 | 0.16 | 0.15 | 6.50 | 4.2 | 900 |
| | H' | 11.00 | 0.23 | 11.00 | 0.23 | 0.14 | 3.50 | 5.0 | 800 |

TABLE 3

| Component layer of hard coating layer | | | Formation condition (Pressure of reaction atmosphere represents kPa and temperature of reaction atmosphere represents ° C.) | | |
|---|---|---|---|---|---|
| Type | | Formation symbol | Composition of reaction gas (volume %) | Reaction atmosphere | |
| | | | | Pressure | Temperature |
| Ti compound layer | TiN | TiN | $TiCl_4$: 4.2%, $N_2$: 30.0%, $H_2$: Remainder | 30.0 | 850 |
| | TiCN | TiCN | $TiCl_4$: 2.0%, $CH_3CN$: 1.0%, $N_2$: 15.0%, $H_2$: Remainder | 7.0 | 900 |
| | TiCNO | TiCNO | $TiCl_4$: 2.0%, $CH_3CN$: 1.0%, CO: 1.0%, $N_2$: 5.0%, $H_2$: Remainder | 13.0 | 900 |
| $Al_2O_3$ layer | TiCN | $Al_2O_3$ | $AlCl_3$: 2.2%, $CO_2$: 5.5%, HCl: 2.2%, $H_2S$: 0.2%, $H_2$: Remainder | 7.0 | 900 |

TABLE 4

| | | | Hard coating layer (Numerical value of lower stage shows average layer thickness (μm).) | | | |
|---|---|---|---|---|---|---|
| | | Tool body symbol | Lower layer | | Upper layer | |
| Type | | | First layer | Second layer | First layer | Second layer |
| Coated tool of present invention/ Comparative coated tool | 1 | A | — | — | — | — |
| | 2 | B | — | — | — | — |
| | 3 | C | — | — | — | — |
| | 4 | A | TiN (0.4) | — | — | — |
| | 5 | B | TiN (0.2) | TiCN (5.1) | TiCNO (0.2) | $Al_2O_3$ (1.2) |

TABLE 4-continued

| | | Hard coating layer (Numerical value of lower stage shows average layer thickness (μm).) | | | |
| | Tool body | Lower layer | | Upper layer | |
| Type | symbol | First layer | Second layer | First layer | Second layer |
|---|---|---|---|---|---|
| | 6 C | TiN (0.4) | TiCN (2.9) | — | — |
| | 7 A | — | — | Al$_2$O$_3$ (2.7) | — |
| | 8 B | TiN (0.2) | TiCN (3.6) | TiCNO (0.2) | Al$_2$O$_3$ (1.7) |
| | 9 D | — | — | — | — |
| | 10 E | — | — | — | — |
| | 11 F | TiN (0.6) | — | TiCNO (0.3) | Al$_2$O$_3$ (1.5) |
| | 12 D | — | — | — | — |
| | 13 E | TiN (0.3) | — | Al$_2$O$_3$ (2.2) | — |
| | 14 F | — | — | — | — |
| | 15 D | TiN (0.5) | TiCN (1.6) | Al$_2$O$_3$ (2.7) | — |
| | 16 E | TiN (0.4) | TiCN (2.2) | TiCNO (0.4) | Al$_2$O$_3$ (3.3) |

"—": not present

TABLE 5

| Type | Tool body symbol | TiAlCN formation symbol | average layer thickness (μm) | TiAlCN composition (atomic ratio) | | Area ratio (area %) of crystal grains having NaCl type face-centered |
|---|---|---|---|---|---|---|
| | | | | $x_{avg}$ | $y_{avg}$ | |
| Coated tool of present invention | 1 A | A | 9.7 | 0.64 | 0.025 | 92 |
| | 2 B | B | 4.0 | 0.82 | 0.000 | 83 |
| | 3 C | C | 8.8 | 0.80 | 0.050 | 80 |
| | 4 A | D | 2.8 | 0.81 | 0.019 | 94 |
| | 5 B | E | 7.2 | 0.83 | 0.041 | 92 |
| | 6 C | F | 1.0 | 0.89 | 0.044 | 88 |
| | 7 A | G | 8.5 | 0.73 | 0.026 | 95 |
| | 8 B | H | 9.0 | 0.60 | 0.045 | 86 |
| | 9 D | A | 20.0 | 0.64 | 0.028 | 90 |
| | 10 E | B | 17.9 | 0.81 | 0.000 | 85 |
| | 11 F | C | 18.9 | 0.80 | 0.050 | 80 |
| | 12 D | D | 18.4 | 0.82 | 0.021 | 93 |
| | 13 E | E | 12.9 | 0.83 | 0.041 | 93 |
| | 14 F | F | 16.1 | 0.90 | 0.039 | 90 |
| | 15 D | G | 18.8 | 0.73 | 0.025 | 96 |
| | 16 E | H | 16.2 | 0.61 | 0.044 | 85 |
| Comparative coated tool | 1 A | A' | 6.7 | 0.51 * | 0.039 | 92 |
| | 2 B | B' | 9.7 | 0.88 | 0.048 | (Only hexagonal crystal) * |
| | 3 C | C' | 4.4 | 0.69 | 0.103 * | 87 |
| | 4 A | D' | 0.7 | 0.76 | 0.014 | 83 |
| | 5 B | E' | 3.3 | 0.88 | 0.021 | 71 * |
| | 6 C | F' | 10.0 | 0.79 | 0.024 | 91 |
| | 7 A | G' | 5.0 | 0.96 * | 0.000 | 43 * |
| | 8 B | H' | 8.6 | 0.73 | 0.015 | 90 |
| | 9 D | A' | 16.2 | 0.52 * | 0.041 | 92 |
| | 10 E | B' | 19.6 | 0.88 | 0.047 | (Only hexagonal crystal) * |
| | 11 F | C' | 11.1 | 0.70 | 0.105 * | 90 |
| | 12 D | D' | 11.7 | 0.76 | 0.015 | 80 |
| | 13 E | E' | 19.2 | 0.89 | 0.023 | 69 * |
| | 14 F | F' | 14.5 | 0.78 | 0.024 | 89 |
| | 15 D | G' | 15.2 | 0.96 * | 0.000 | 44 * |
| | 16 E | H' | 28.4 | 0.73 | 0.018 | 93 |

TABLE 5-continued

| Type | | $S_l$ (area %) | $S_s$ (area %) | $S_{ls}$ (area %) | $\Delta x_l$ | $\Delta x_s$ | Average grain width W (μm) | Aspect ratio A |
|---|---|---|---|---|---|---|---|---|
| Coated tool of present invention | 1 | 10 | 66 | 10 | 0.04 | 0.04 | 1.27 | 8.9 |
| | 2 | 14 | 76 | 6 | 0.08 | 0.09 | 0.59 | 8.4 |
| | 3 | 40 | 80 | 20 | 0.23 | 0.12 | 1.20 | 6.7 |
| | 4 | 32 | 64 | 16 | 0.21 | 0.05 | 0.47 | 12.5 |
| | 5 | 24 | 72 | 23 | 0.10 | 0.07 | 0.80 | 9.8 |
| | 6 | 27 | 82 | 21 | 0.16 | 0.11 | 0.47 | 10.0 |
| | 7 | 15 | 86 | 9 | 0.06 | 0.09 | 1.10 | 4.8 |
| | 8 | 34 | 60 | 30 | 0.14 | 0.02 | 1.17 | 9.0 |
| | 9 | 12 | 66 | 12 | 0.04 | 0.04 | 2.29 | 1.5 |
| | 10 | 12 | 76 | 4 | 0.07 | 0.09 | 1.89 | 1.7 |
| | 11 | 40 | 80 | 21 | 0.23 | 0.12 | 2.00 | 5.0 |
| | 12 | 33 | 64 | 17 | 0.21 | 0.05 | 1.99 | 7.6 |
| | 13 | 23 | 72 | 23 | 0.10 | 0.07 | 1.46 | 5.9 |
| | 14 | 24 | 84 | 19 | 0.15 | 0.11 | 1.66 | 6.0 |
| | 15 | 14 | 87 | 8 | 0.06 | 0.09 | 2.01 | 2.1 |
| | 16 | 33 | 60 | 29 | 0.14 | 0.02 | 1.73 | 5.4 |
| Comparative coated tool | 1 | 23 | 76 | 15 | 0.07 | 0.05 | 0.46 | 5.6 |
| | 2 | (Only hexagonal crystal) * | | | | | | |
| | 3 | 68 * | 74 | 50 | 0.22 | 0.07 | 0.42 | 8.6 |
| | 4 | 16 | none * | none | 0.11 | none | 0.08 | 7.0 |
| | 5 | 13 | 59 * | 13 | 0.09 | 0.03 | 0.11 | 6.3 |
| | 6 | none * | none * | none | none | none | 0.72 | 3.9 |
| | 7 | none * | none * | none | none | none | 0.20 | 5.0 |
| | 8 | none * | 77 | none | none | none | 0.07 | 0.57 | 4.1 |
| | 9 | 24 | 77 | 16 | 0.08 | 0.05 | 1.34 | 2.1 |
| | 10 | (Only hexagonal crystal) * | | | | | | |
| | 11 | 69 * | 76 | 51 | 0.22 | 0.07 | 1.04 | 6.1 |
| | 12 | 16 | none * | none | 0.11 | none | 0.86 | 2.9 |
| | 13 | 14 | 59 * | 14 | 0.10 | 0.03 | 1.57 | 0.5 |
| | 14 | none * | none * | none | none | none | 1.14 | 2.2 |
| | 15 | none * | none * | none | none | none | 1.14 | 1.1 |
| | 16 | none * | 78 | none | none | none | 0.08 | 2.40 | 0.3 |

(Note 1)
$S_l$ is an area ratio of crystal grains satisfying a first average cycle and $S_s$ is an area ratio of crystal grains satisfying a second average cycle.
(Note 2)
$S_{ls}$ is an area ratio of crystal grains in which zones satisfying a first average cycle and a second average cycle are present in the same grains.
(Note 3)
Mark * in the column indicates that the prescription of Claim 1 is not satisfied.
(Note 4)
In Comparative coated tools 6, 7, 14, and 15, crystal grains having the repetition of the increase and decrease of a content ratio x of Al are not present.
(Note 5)
In Comparative coated tools 8 and 16, crystal grains having the repetition of the increase and decrease of a content ratio x of Al are present but crystal grains having an average distance davgl (40 to 160 nm) and the repetition of the increase and decrease of a content ratio x of Al are not present.
(Note 6)
In Comparative coated tools 4 and 12, crystal grains having the repetition of the increase and decrease of a content ratio x of Al are present but crystal grains having an average distance davgs (1 to 7 nm) and the repetition of the increase and decrease of a content ratio x of Al are not present.

Subsequently, with regard to the coated tools 1 to 8 of the present invention and the comparative coated tools 1 to 8, in a state where the various tool bodies A to C (the shape of ISO standard SEEN1203AFSN) were clamped to a tip portion of a cutter, which was made of alloy steel and had a cutter diameter of 80 mm, by a fixing jig, wet high-speed face milling for alloy steel and a center cutting test 1 to be described below were performed and the wear width of flank face of a cutting edge was measured. Results of the cutting test 1 are shown in Table 6. Since each of the comparative coated tools 1 to 8 reached the end of the life thereof before the end of the cutting time due to the occurrence of chipping, a time until each of the comparative coated tools reached the end of the life thereof is shown.

Cutting test 1: wet high-speed face milling, center cutting test

Cutter diameter: 80 mm

Work material: block material having a width of 60 mm and a length of 250 mm of JIS/SCM440

Rotation speed: 1393 min$^{-1}$

Cutting speed: 350 m/min

Depth of cut: 2.0 mm

Feed: 0.3 mm/tooth

Cutting time: 6 min (Normal cutting speed is 200 m/min)

TABLE 6

| Type | | Wear width of flank face (mm) Cutting test 1 | Type | | Cutting time until end of life (min) Cutting test 1 |
|---|---|---|---|---|---|
| Coated tool of present invention | 1 | 0.13 | Comparative coated tool | 1 | 2.1 |
| | 2 | 0.19 | | 2 | 1.4 |
| | 3 | 0.10 | | 3 | 3.2 |
| | 4 | 0.14 | | 4 | 2.6 |

TABLE 6-continued

| Type | Wear width of flank face (mm) Cutting test 1 | Type | Cutting time until end of life (min) Cutting test 1 |
|---|---|---|---|
| 5 | 0.09 | 5 | 3.5 |
| 6 | 0.10 | 6 | 5.0 |
| 7 | 0.16 | 7 | 1.6 |
| 8 | 0.12 | 8 | 5.8 |

Cutting time (min) of comparative coated tool until end of life means cutting time (min) until comparative coated tool reaches end of life due to occurrence of chipping.

Further, with regard to the coated tools 9 to 16 of the present invention and the comparative coated tools 9 to 16, in a state where the various coated tool bodies D to F (the shape of ISO standard CNMG120412) were screwed to a tip portion of a cutting tool, which was made of alloy steel, by a fixing jig, a dry high-speed intermittent cutting test 2 for ductile cast iron to be described below was performed and the wear width of flank face of a cutting edge was measured. Results of the cutting test 2 are shown in Table 7. Since each of the comparative coated tools 9 to 16 reached the end of the life thereof before the end of the cutting time due to the occurrence of chipping, a time until each of the comparative coated tools reached the end of the life thereof is shown.

Cutting test 2: wet high-speed intermittent cutting

Work material: round bar including eight vertical grooves arranged at regular intervals in length direction of JIS/FCD700

Cutting speed: 300 m/min

Depth of cut: 2.0 mm

Feed rate: 0.3 mm/rev

Cutting time: 3 min (Normal cutting speed is 200 m/min)

TABLE 7

| Type | | Wear width of flank face (mm) Cutting test 2 | Type | | Cutting time until end of life (min) Cutting test 2 |
|---|---|---|---|---|---|
| Coated tool of present invention | 9 | 0.16 | Comparative coated tool | 9 | 1.1 |
| | 10 | 0.18 | | 10 | 0.5 |
| | 11 | 0.13 | | 11 | 2.0 |
| | 12 | 0.12 | | 12 | 2.8 |
| | 13 | 0.11 | | 13 | 2.4 |
| | 14 | 0.13 | | 14 | 2.7 |
| | 15 | 0.18 | | 15 | 0.7 |
| | 16 | 0.15 | | 16 | 1.4 |

Cutting time (min) of comparative coated tool until end of life means cutting time (min) until comparative coated tool reaches end of life due to occurrence of chipping.

From the results shown in Tables 6 and 7, since the hard coating layer of each of the coated tools 1 to 16 of the present invention has excellent chipping resistance and excellent peeling resistance, the coated tools 1 to 16 of the present invention exhibit excellent wear resistance for a long term without the occurrence of chipping even in a case where the coated tools 1 to 16 of the present invention are used in high-speed intermittent cutting work for alloy steel or cast iron. On the other hand, in a case where the comparative coated tools 1 to 16, which do not satisfy even one of the items prescribed in the coated tool according to the embodiment of the present invention, are used in high-speed intermittent cutting work for alloy steel or cast iron, each of the comparative coated tools 1 to 16 reaches the end of the life thereof in a short time due to the occurrence of chipping.

INDUSTRIAL APPLICABILITY

As described above, the coated tool according to the embodiment of the present invention can also be used as a coated tool for high-speed intermittent cutting work for materials other than alloy steel or cast iron and exhibits excellent chipping resistance and excellent wear resistance for a long term. Accordingly, the coated tool according to the embodiment of the present invention can sufficiently satisfy the improvement of the performance of a cutting device, the labor saving and the energy saving of cutting work, and a reduction in cost.

REFERENCE SIGNS LIST

1: grain boundary
2: analysis line of EDS using TEM
3: layer thickness direction
D: distance
m: straight line m

What is claimed is:

1. A surface-coated cutting tool comprising:
a tool body; and
a hard coating layer that includes a Ti—Al complex carbonitride or nitride layer on a surface of the tool body, wherein
(a) a ratio of crystal grains of Ti—Al complex carbonitride or nitride, which has a NaCl type face-centered cubic structure, in the Ti—Al complex carbonitride or nitride layer is 80 area % or more,
(b) in the Ti—Al complex carbonitride or nitride layer, $x_{avg}$ and $y_{avg}$ satisfy $0.60 \leq x_{avg} \leq 0.90$ and $0.000 \leq y_{avg} \leq 0.050$, respectively, a composition of the Ti—Al complex carbonitride or nitride layer being represented by a composition formula of $(Ti_{1-x}Al_x)(C_yN_{1-y})$, the $x_{avg}$ being an average of x that is an Al content in a total content of Al and Ti, the $y_{avg}$ being an average of y that is a C content in a total content of C and N, and the x, the y, the $x_{avg}$ and $y_{avg}$ being atomic ratios,
(c) the crystal grains which have the NaCl type face-centered cubic structure include crystal grains in which the x repeatedly increases and decreases in a direction perpendicular to the surface of the tool body,
(d) the crystal grains in which the x repeatedly increases and decreases include 10 to 40 area % of crystal grains $G_l$ including a region having a first distance $d_{avg1}$ in which an average distance of the repeated increase and decrease is 40 to 160 nm, and
(e) the crystal grains in which the x repeatedly increases and decreases include 60 area % or more of crystal grains $G_s$ including a region having a second distance $d_{avgs}$ in which an average distance of the repeated increase and decrease is 1 to 7 nm.

2. The surface-coated cutting tool according to claim 1, wherein the crystal grains in which the x repeatedly increases and decreases include 10 to 30 area % of crystal grains $G_{ls}$ including the region having the first distance $d_{avg1}$ and the region having the second distance $d_{avgs}$ in a single crystal grain.

3. The surface-coated cutting tool according to claim 1, wherein the crystal grains having the NaCl type face-centered cubic structure has an average grain width w of 0.10 to 2.00 μm and an average aspect ratio A of 2.0 to 10.0.

4. The surface-coated cutting tool according to claim 1, wherein in the crystal grains in which the x repeatedly increases and decreases, an average value Δx is 0.05 to 0.20 in the region having the first distance $d_{avg1}$ and 0.03 to 0.10 in the region having the second distance $d_{avgs}$, the Δx being a difference between a local maximum $x_{max}$ and a local minimum $x_{min}$ adjacent to each other.

* * * * *